(12) United States Patent
Wan et al.

(10) Patent No.: US 7,741,981 B1
(45) Date of Patent: Jun. 22, 2010

(54) DUAL-USE COMPARATOR/OP AMP FOR USE AS BOTH A SUCCESSIVE-APPROXIMATION ADC AND DAC

(75) Inventors: Ho Ming Karen Wan, Hong Kong (HK); Yat To William Wong, Hong Kong (HK); Kwai Chi Chan, Hong Kong (HK); Hok Mo Yau, Hong Kong (HK); Tin Ho Andy Wu, Hong Kong (HK); Kwok Kuen David Kwong, Davis, CA (US)

(73) Assignee: Hong Kong Applied Science and Technology Research Institute Co., Ltd., Hong Kong (CN)

( * ) Notice: Subject to any disclaimer, the term of this patent is extended or adjusted under 35 U.S.C. 154(b) by 11 days.

(21) Appl. No.: 12/345,844

(22) Filed: Dec. 30, 2008

(51) Int. Cl.
*H03M 1/00* (2006.01)

(52) U.S. Cl. .................. 341/110; 341/155; 341/144

(58) Field of Classification Search .................. 341/108, 341/110, 155, 144
See application file for complete search history.

(56) References Cited

U.S. PATENT DOCUMENTS

| | | | |
|---|---|---|---|
| 4,609,906 A * | 9/1986 | Wiegel | 341/108 |
| 5,995,033 A | 11/1999 | Roeckner et al. | |
| 6,255,972 B1 | 7/2001 | Gross, Jr. et al. | |
| 6,359,575 B1 | 3/2002 | Knudsen | |
| 7,138,932 B1 * | 11/2006 | Chen | 341/108 |
| 7,265,705 B1 * | 9/2007 | Lee et al. | 341/162 |
| 7,471,227 B2 * | 12/2008 | Cho | 341/161 |

* cited by examiner

*Primary Examiner*—Brian Young
(74) *Attorney, Agent, or Firm*—Stuart T. Auvinen; g Patent LLC

(57) ABSTRACT

A re-configurable circuit acts as an Analog-to-Digital Converter (ADC) and as a digital-to-analog converter (DAC). An array of binary-weighted capacitors stores an analog input. Switches connect different capacitors in the array to fixed voltages that cause charge-sharing with a terminal capacitor. The voltage of the terminal capacitor is compared by a re-configurable comparator stage for each different combination of the capacitors. The comparison results are analyzed to determine the closest digital value for the analog input. In DAC mode, the array capacitors are switched based on an input digital value. The switched capacitors connect to a charge-sharing line to generate an analog voltage that is applied to the re-configurable comparator stage. A differential amplifier generates a buffered analog voltage that is fed back to the other input of the re-configurable comparator stage for unity gain. The gain of the re-configurable comparator stage adjusts for ADC and DAC modes.

20 Claims, 5 Drawing Sheets

DUAL-USE COMPARATOR/OP AMP FOR USE AS BOTH A SUCCESSIVE-APPROXIMATION ADC AND DAC

FIELD OF THE INVENTION

This invention relates to data converter systems, and more particularly to analog-to-digital and digital-to-analog converters.

BACKGROUND OF THE INVENTION

Larger system chips such as a System-on-a-Chip (SoC) often include analog as well as digital circuits. Signals may cross from the digital domain to the analog domain, and vice-versa. Analog signals may be converted to digital for complex processing, such as by a Digital Signal Processor (DSP), and results may be converted from digital to analog. Some system chips may be configurable to fit several applications, and these applications may have different requirements for analog-digital conversions. However, it is desirable to use the same analog-digital converter circuits for these varied applications.

Many types of Analog-to-Digital Converters (ADC's) have been used for a wide variety of applications. Flash ADC's compare analog signal voltages to multiple voltage levels in an instant to produce a multi-bit digital word that represents the analog voltage. Successive-approximation ADC's use a series of stages to convert an analog voltage to digital bits. Each stage compares an analog voltage to a reference voltage, producing one digital bit. In sub-ranging ADC's, each stage compares an analog voltage to several voltage levels, so that each stage produces several bits. Succeeding stages generate lower-significant digital bits than do earlier stages in the pipeline.

Algorithmic, re-circulating, or recycling ADC's use a loop to convert an analog voltage. The analog voltage is sampled and compared to produce a most-significant digital bit. Then the digital bit is converted back to analog and subtracted from the analog voltage to produce a residue voltage. The residue voltage is then multiplied by two and looped back to the comparator to generate the next digital bit. Thus the digital bits are generated over multiple cycles in the same comparator stage.

FIG. 1 shows a Successive-Approximation-Register ADC. Successive-Approximation-Register SAR 302 receives a clock CLK and contains a register value that is changed to gradually zero-in on a close approximation of the analog input voltage VIN. For example, the value in SAR 302 may first be 0.5, then 0.25, then 0.375, then 0.312, then 0.281, then 0.296, then 0.304, then 0.308, then 0.31, then 0.311, and finally 0.312 when comparing to a VIN of 0.312 volts. SAR 302 outputs the current register value to digital-to-analog converter (DAC) 300, which receives a reference voltage VREF and converts the register value to an analog voltage VA.

The input analog voltage VIN is applied to sample-and-hold circuit 304, which samples and holds the value of VIN. For example, a capacitor can be charged by VIN and then the capacitor isolated from VIN to hold the analog voltage. The sampled input voltage from sample-and-hold circuit 304 is applied to the inverting input of comparator 306. The converted analog voltage VA is applied to the non-inverting input of comparator 306.

Comparator 306 compares the converted analog voltage VA to the sampled input voltage and generates a high output when the converted analog voltage VA is above the sampled VIN, and the register value in SAR 302 is too high. The register value in SAR 302 can then be reduced.

When the converted analog voltage VA is below the sampled input voltage, comparator 306 generates a low output to SAR 302. The register value in SAR 302 is too low. The register value in SAR 302 can then be increased for the next cycle.

The register value from SAR 302 is a binary value of N bits, with D(N-1) being the most-significant-bit (MSB) and D0 being the least-significant-bit (LSB). SAR 302 can first set the MSB D(N-1), then compare the converted analog voltage VA to the input voltage VIN, then adjust the MSB and/or set the next MSB D(N-2) based on the comparison. The set and compare cycle repeats until after N cycles the LSB is set. After the last cycle, the end-of-cycle EOC signal is activated to signal completion. A state machine or other controller can be used with or included inside SAR 302 to control sequencing.

Since ADC's may be relatively large circuits, it is desirable to use ADC's for many applications. It is also desired to use some of the ADC circuits for conversion in the reverse direction, as a DAC. A dual-use circuit that can be used for both an ADC and a DAC is desirable. Circuit components that can be used for both an ADC and a DAC are desirable. A comparator stage that can be configured for use in an ADC and re-configured for use in a DAC is desirable.

DETAILED DESCRIPTION

The present invention relates to an improvement in combined ADC/DAC's. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that a comparator stage in a SAR ADC can be re-configured for use in a charge-scaling DAC. Capacitors used in the SAR ADC can be re-used in the DAC, and a re-configurable comparator stage can be used in both the ADC and the DAC. The re-configurable stage can have an amplifier that acts as a comparator in ADC mode, and acts as a stable unity-gain operation amplifier in DAC mode.

Figure 1:
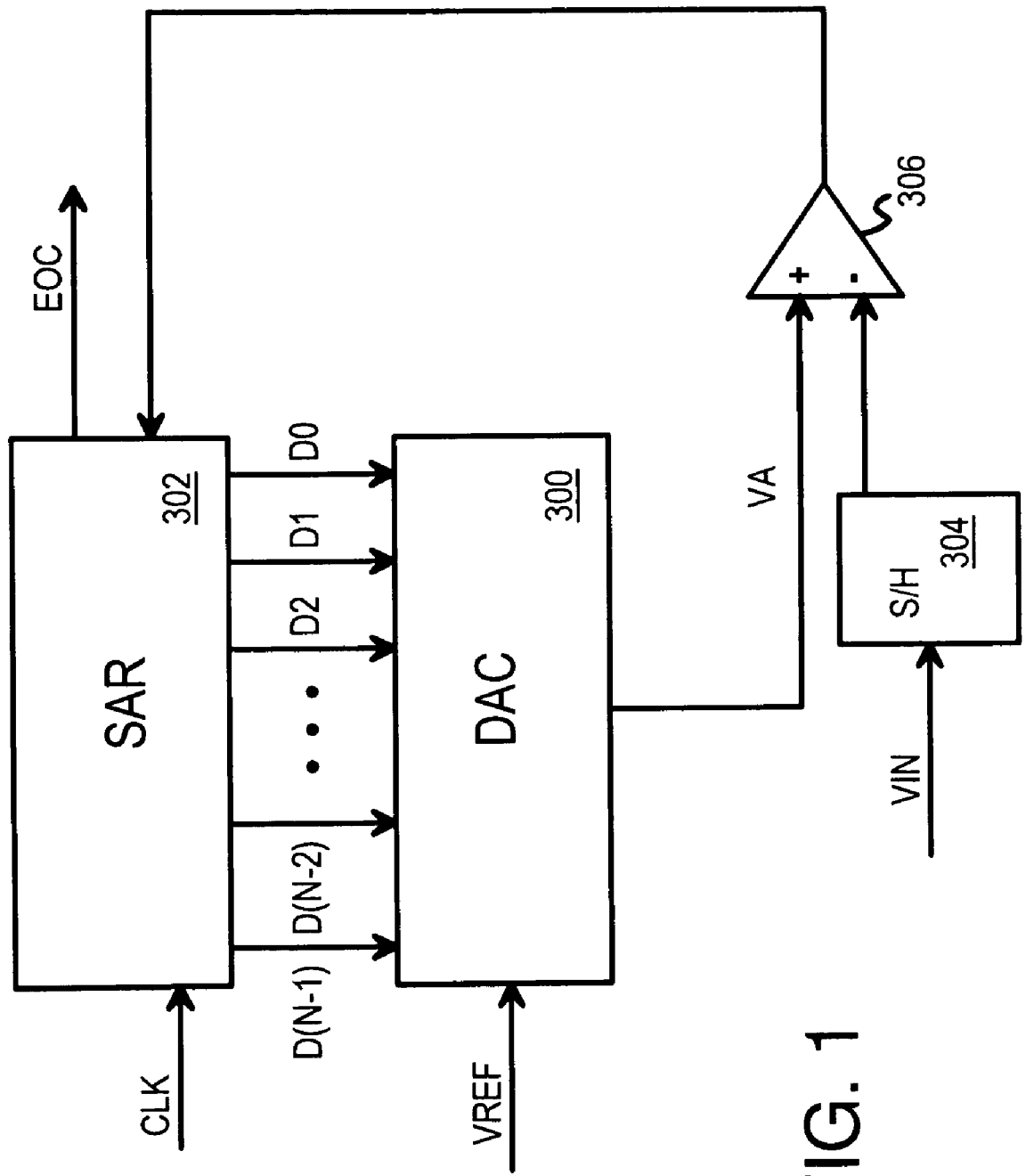
FIG. 1 shows a Successive-Approximation-Register ADC.
Figure 2:
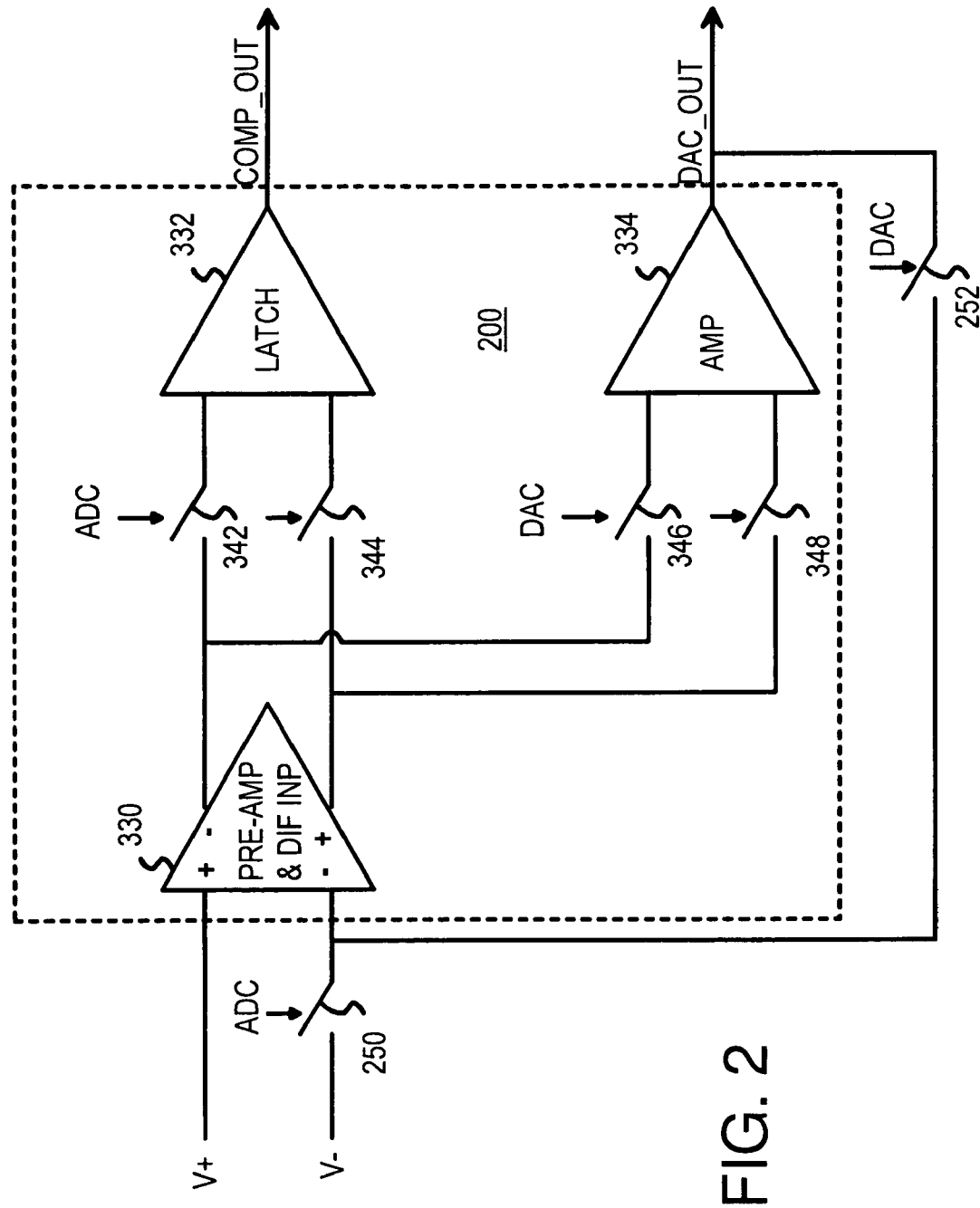
FIG. 2 shows a re-configurable comparator stage that can be used in both an ADC and in a DAC.

FIG. 2 shows a re-configurable comparator stage that can be used in both an ADC and in a DAC. An input voltage V+, V− is generated by an array of capacitors that can be switched in a sequence during a conversion process. Re-configurable comparator stage 200 has differential pre-amplifier 330 that receives a differential input, either V+, V− in ADC mode when switch 250 is closed, or V+, DAC_OUT in DAC mode when switch 250 is open and switch 252 is closed.

Differential pre-amplifier 330 amplifies the voltage difference on its inputs and generates a differential output. The differential output is applied through switches 342, 344 during ADC mode to differential latch 332, which latches the voltage difference and generates a compare output COMP_OUT. The compare output indicates when V+ was high than V−. Control logic can switch different capacitors to generate V+, V−, allowing re-configurable comparator stage to determine which capacitor sizes produce voltages above and below a sampled analog input voltage, and to then generate a digital value based on these comparison results.

The differential output from differential pre-amplifier 330 is also applied through switches 346, 348 during DAC mode to differential amplifier 334, which amplifies the voltage difference and generates an analog voltage DAC_OUT. The DAC output is the sum of voltages on capacitors connected to the V+ input line by the capacitor array. A digital value can control switches in the capacitor array to connect some capacitors and not others. The charge stored on the connected capacitors represent the digital value. The charges are converted to voltages which are amplified and output by differential amplifier 334, which acts as a unity gain operational amplifier (op amp). The DAC output is fed back through switch 252 to the inverting input of differential pre-amplifier 330. The DAC output is adjusted by re-configurable comparator stage 200 until it matches the V+ input.

Figure 3:
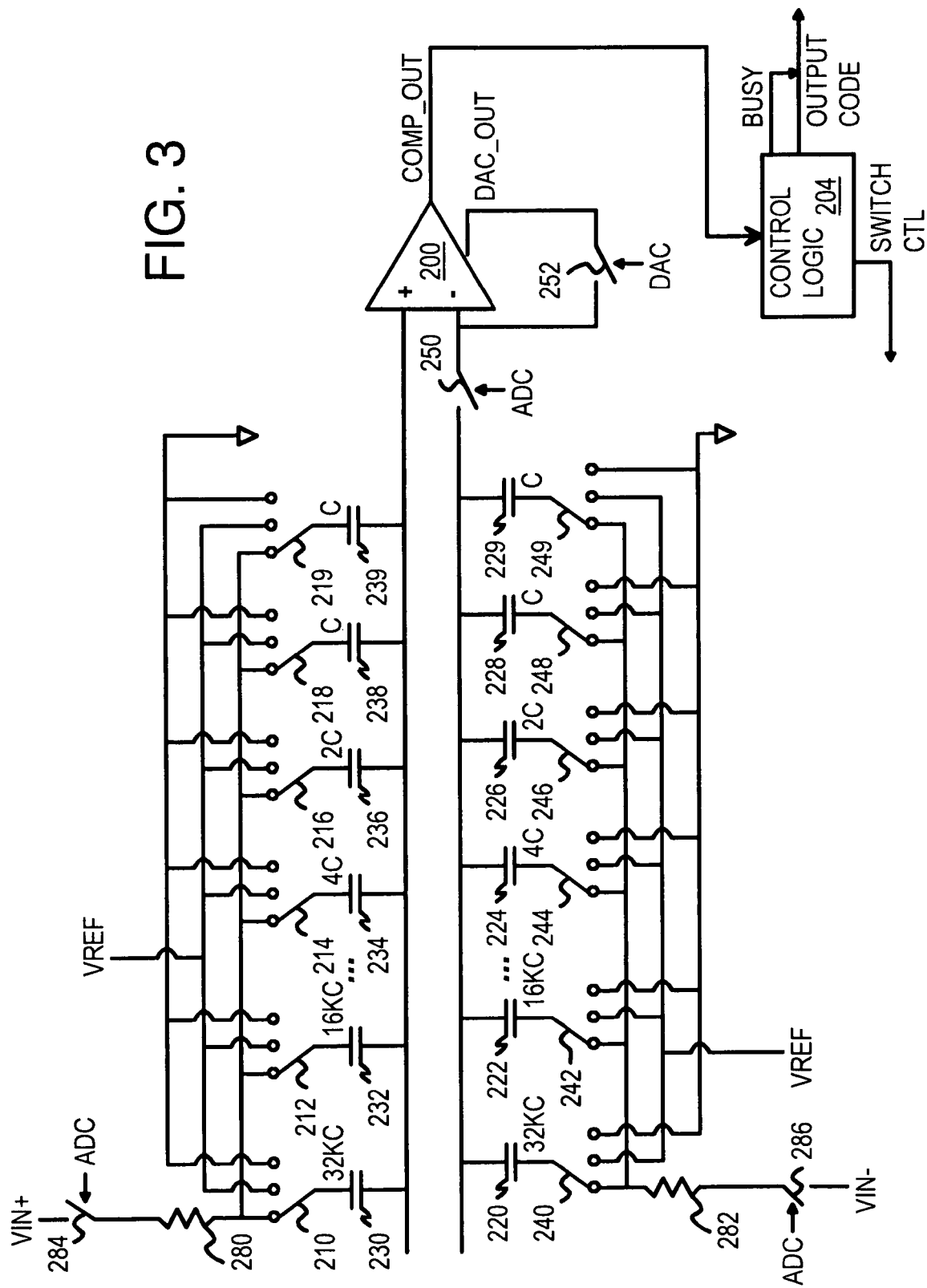
FIG. 3 shows a dual-use ADC/DAC.

FIG. 3 shows a dual-use ADC/DAC. Re-configurable comparator stage 200 was shown in FIG. 2, with switch 250 closing for ADC mode and switch 252 closing for DAC mode. Re-configurable comparator stage 200 operates as a differential comparator in ADC mode, and as a unity-gain feedback op amp in DAC mode.

The sizes of capacitors 238-230 increase in binary weights, such as C, 2C, 4C, 8C, 16C, 32C, ... 1KC, 2KC, 4KC, 16KC, 32KC. This array of binary-weighted capacitors 230-238 and terminal capacitor 239 are switched by switches 210-219. Each capacitor is controlled by a binary bit from a digital value, such as a digital value in a register or Successive-Approximation-Register (SAR). The binary bit can be merged with other control or timing information, such as from control logic 204 or a sequencer or multi-phase non-overlapping clock. For example, the 32-bit binary value 10 . . . 010 causes switch 210 to connect 32K capacitor 230 to VREF, switch 212 to connect 16K capacitor 232 to ground, . . . switch 214 to connect 4C capacitor 234 to ground switch 216 to connect 2C capacitor 236 to VREF, and switch 218 to connect 1C capacitor 284 to ground.

Binary-weighted capacitors 230-238 and terminal capacitor 239 are switched by switches 210-219 to connect each to either ground, reference voltage VREF, or input voltage VIN+ through switch 284 and resistor 280. The other plates of binary-weighted capacitors 230-238 and terminal capacitor 239 connect to charge-sharing line V+, which is applied to the non-inverting (+) input of re-configurable comparator stage 200. As switches 210-218 connect capacitors 230-238 to different voltages VREF, VIN+, and ground, charge is moved from capacitors 230-238 through charge-sharing line V+ to terminal capacitor 239. Terminal capacitor 239 has a capacitance value of C, which is the same as the capacitance value of the smallest 1C capacitor 238 in binary-weighted capacitors 230-238.

The voltage on charge-sharing line V+ is a function of these voltages and capacitance values. Charge is conserved on charge-sharing line V+, so changing voltages causes charge to shift from one capacitor to another. For example, when all capacitors are switched to ground, and then only 2C capacitor 236 is switched to VREF, the voltage on charge-sharing line V+ is VREF*(2C/Ctotal), where Ctotal is the sum of capacitors 230-239.

In general, V+=(VREF/2)*sum($b_i/C_i$), where $b_i$ is the binary bit, either 1 or 0, that controls the switch to VREF for capacitor i, and $C_i$ is the binary weight of capacitor ratio i, such as 1, 2, 4, 8, . . . 16K, 32K. Other equations may apply for other switching methods or circuit arrangements, depending on the charge-sharing methods used.

Likewise, the sizes of capacitors 228-220 increase in binary weights, such as C, 2C, 4C, 8C, 16C, 32C, . . . 1KC, 2KC, 4KC, 16KC, 32KC. Capacitors 220-228 and terminal capacitor 229 are switched by switches 240-249. Each capacitor is controlled by a binary bit from a digital value, such as a digital value in a register or Successive-Approximation-Register (SAR). The binary bit can be merged with other control or timing information, such as from control logic 204 or a sequencer or multi-phase non-overlapping clock.

Binary-weighted capacitors 220-228 and terminal capacitor 229 are switched by switches 240-249 to connect each to either ground, reference voltage VREF, or input voltage VIN− through switch 286 and resistor 282. The other plates of binary-weighted capacitors 220-228 and terminal capacitor 229 connect to charge-sharing line V−, which is applied to the inverting (−) input of re-configurable comparator stage 200 through switch 250 during ADC mode. As switches 240-248 connect capacitors 220-228 to different voltages VREF, VIN−, and ground, charge is moved from capacitors 220-228 through second charge-sharing line V− to terminal capacitor 229. Terminal capacitor 229 has a capacitance value of C, which is the same as the capacitance value of the smallest 1C capacitor 228 in binary-weighted capacitors 220-228.

The voltage on second charge-sharing line V− is a function of these voltages and capacitance values. Charge is conserved on charge-sharing line V−, so changing voltages causes charge to shift from one capacitor to another.

During DAC mode, switches 284, 286, 250 are open. Second charge-sharing line V− is disconnected from re-configurable comparator stage 200, and binary-weighted capacitors 220-228 and terminal capacitor 229 are not used in DAC mode. Instead, the DAC output DAC_OUT from re-configurable comparator stage 200 is fed back through switch 252 to the inverting input of re-configurable comparator stage 200 to provide unity-gain feedback. Re-configurable comparator stage 200 adjusts DAC_OUT until DAC_OUT is the same voltage as V+. DAC_OUT may then be output as the analog voltage that is represented by the binary bits that were applied to switches 210-218 to select which of binary-weighted capacitors 230-238 are driven by VREF and share charge with terminal capacitor 229 to generate V+.

Control logic 204 examines the compare output COMP_OUT of re-configurable comparator stage 200 during ADC mode as different ones of binary-weighted capacitors 220-228 and 230-238 are switched to the various voltages VIN+, VIN−, VREF, ground. While the capacitors are being switches and re-configurable comparator stage 200 is comparing voltages, control logic 204 outputs a BUSY signal. Once all binary bits have been tested and the final digital value that most closely matches the analog inputs VIN+, VIN− is reached, BUSY is deasserted and a success output code can be output. A failure code or other diagnostic code may also be output. The number of significant bits, or size of the binary value may be adjusted or set for control logic 204, such as for different applications. Applications that need more significant bits may require that control logic 204 take more time to test more binary bits against the input analog voltage.

Two switches to ground (not shown) may be used to drive V+, V− to ground or any other reference voltage. Another switch (not shown) between V+, V− may be added to equalize V+, V−.

Having a single amplifier connected to the charge-sharing lines V+, V− is better than having two or more separate amplifiers, since the loading on the charge-sharing lines V+, V− is reduced. Less distortion of charge-sharing and better conversion accuracy results when the amplifier load capacitance on the charge-sharing line is small.

Figure 4:
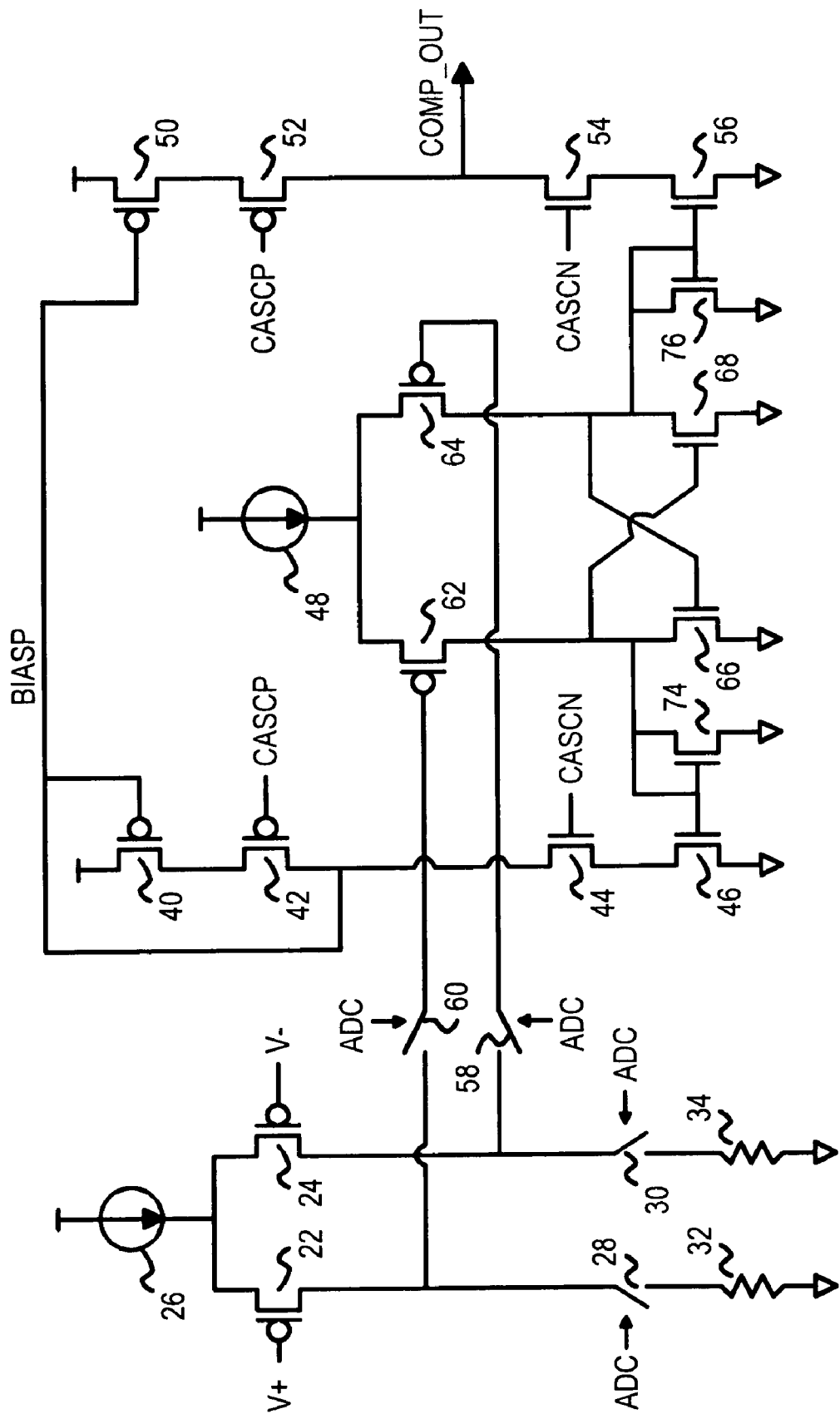
FIG. 4 is a schematic diagram of a re-configurable comparator stage operating in the ADC mode.

FIG. 4 is a schematic diagram of a re-configurable comparator stage operating in the ADC mode. Current source 26 supplies a current to the sources of p-channel differential transistors 22, 24, which receive V+, V−, respectively. V+, V− are charge-sharing lines in the capacitor array that receives the reference voltage and analog input voltage that are compared.

In the ADC mode, switches 28, 30 close to sink current from differential transistor 22 through sink resistor 32, and to sink current from differential transistor 24 through sink resistor 34. Sink resistor 32, 34 increase the gain of differential pre-amplifier 330 of FIG. 2, which includes differential transistors 22, 24.

Switches 58, 60 correspond to switches 342, 344 of FIG. 2, and the right side of FIG. 4 corresponds to differential latch 332 of FIG. 2. The differential latch includes cross-coupled n-channel transistors 66, 68, which have their gates and drains cross-coupled. Current source 48 provides a latching current to the sources of p-channel trigger transistors 62, 64, which have gates driven by differential transistors 22, 24 in the differential pre-amplifier stage when switches 60, 58 are closed in ADC mode.

The voltage difference V+, V− created in the switched capacitor array is amplified by differential transistors 22, 24 and drive an amplified voltage difference onto the gates of p-channel trigger transistors 62, 64, which causes an imbalance in current to cross-coupled n-channel transistors 66, 68. This current imbalance triggers the bi-stable latch of cross-coupled n-channel transistors 66, 68 due to positive feedback in the cross-coupled connection of cross-coupled n-channel transistors 66, 68. Either a high or a low is latched into cross-coupled n-channel transistors 66, 68.

The drain of cross-coupled n-channel transistor 66 is connected to the drain and gate of n-channel transistor 74, which helps to secure and hold the latched state. The gate voltage of n-channel transistor 74 is mirrored to the gate of n-channel transistor 46, which sinks a current from the series of p-channel source transistor 40, p-channel cascode transistor 42, and n-channel cascode transistor 44. Bias voltage BIASP is generated from the node between the drains of cascode transistors 42, 44, and is applied to the gates of p-channel source transistor 40 and also to p-channel source transistor 50 in the output leg.

The opposite state is latched into the drain of cross-coupled n-channel transistor 68, which is connected to the drain and gate of n-channel transistor 76, which helps to secure and hold the opposite latched state. The gate voltage of n-channel transistor 76 is mirrored to the gate of n-channel transistor 56, which sinks a current from output leg series of p-channel source transistor 50, p-channel cascode transistor 52, and n-channel cascode transistor 54.

The gates of p-channel cascode transistors 42, 52 are driven by cascode bias voltage CASCP, while the gates of n-channel cascode transistors 44, 54 are driven by cascode bias voltage CASCN. CASCP and CASCN can be generated by a bias circuit (not shown) such as a voltage divider using transistors, resistors, or various combinations.

The drains of cascode transistors 52, 54 drive the comparator output COMP_OUT, which indicates when V+ is higher than V−. By switching different capacitors with the analog input voltages VIN+, VIN− and ground and the reference voltage VREF and comparing V+, V−, control logic can determine the digital value that most closely represents the analog input voltage. One of VIN+, VIN− may be the analog input voltage and the other be a reference voltage when a single-ended analog input is received, of both VIN+, VIN− may be connected to analog inputs when a differential analog voltage is to be digitized.

Figure 5:
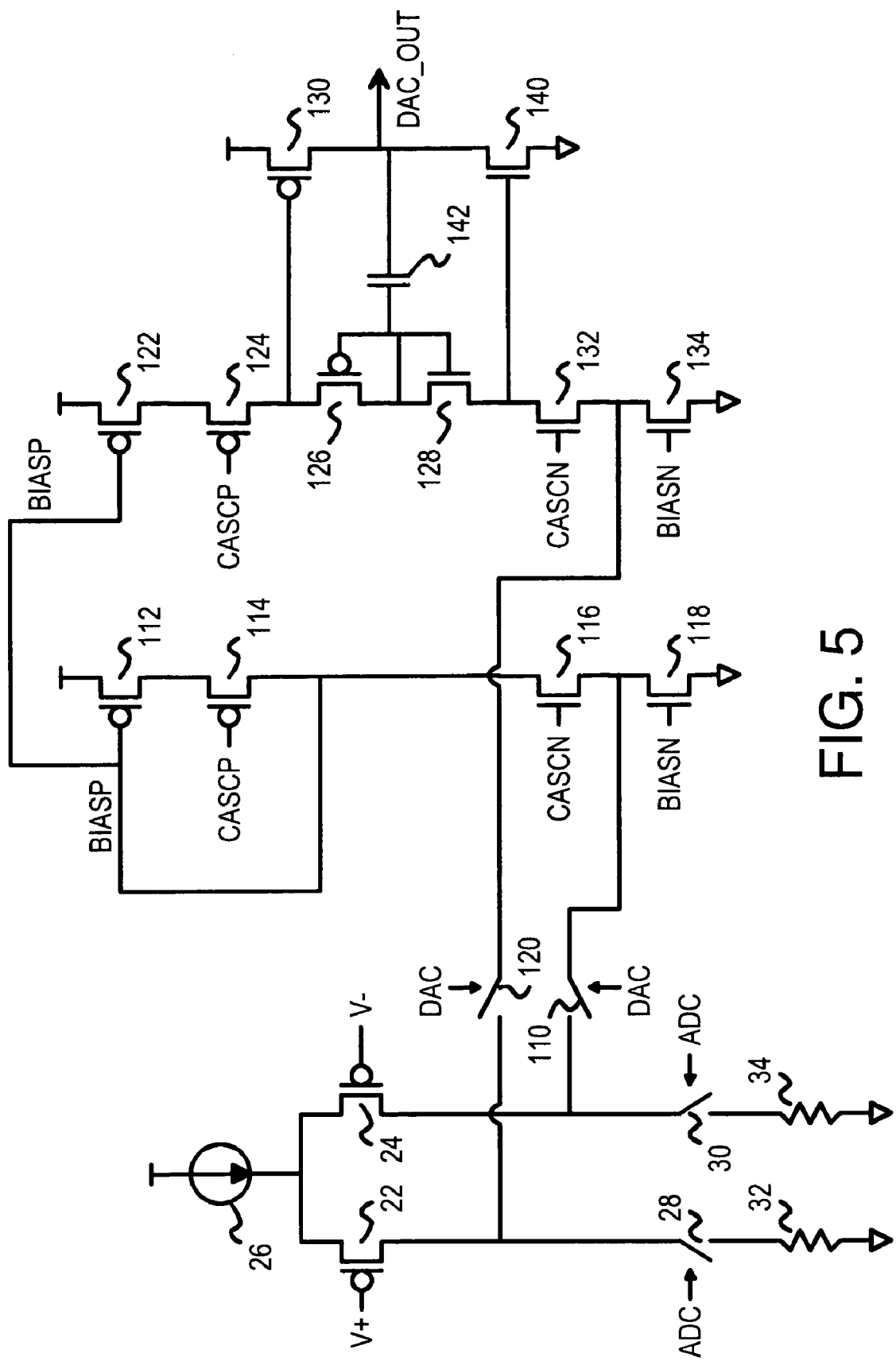
FIG. 5 is a schematic diagram of the re-configurable comparator stage operating in the DAC mode.

FIG. 5 is a schematic diagram of the re-configurable comparator stage operating in the DAC mode. In the pre-amplifier stage, current source 26 supplies a current to the sources of p-channel differential transistors 22, 24, which receive V+, V−, respectively. V+ is the charge-sharing line in the capacitor array that switches capacitors based on a digital value in a register such as in a Successive-Approximation-Register (SAR). V− is connected to the DAC output by switch 252 of FIG. 2 to provide feedback for unity gain. The digital value from the SAR drives the switches to the binary-weighted capacitors in the capacitor array, causing charge sharing which shifts the voltage of V+. This voltage of V+ is sensed and buffered to generate DAC_OUT, which is an analog voltage that represents the digital value that selected the capacitors connected to V+.

In the DAC mode, switches 28, 30 remain open to disconnect differential transistors 22, 24 from sink resistors 32, 34. A faster response time and higher gain is achieved by disconnecting sink resistors 32, 34 during DAC mode. In DAC mode, p-channel differential transistors 22, 24 and current source 26 act as a differential input stage rather than a pre-amplifier. The current difference among p-channel differential transistors 22, 24 are fed through switches 120, 110 to a folded cascode amplifier stage that also acts as the output buffer stage. When the DAC_OUT output is fed back to the V− input, this circuit operates as a high performance op amp with unity gain and stability.

Switches 120, 110 correspond to switches 346, 348 of FIG. 2, and the right side of FIG. 5 corresponds to differential amplifier 334 of FIG. 2. The biasing leg includes p-channel bias transistor 112, p-channel cascode transistor 114, n-channel cascode transistor 116, and n-channel bias transistor 118 in series between power and ground.

The main leg includes p-channel bias transistor 122, p-channel cascode transistor 124, p-channel compensating transistor 126, n-channel compensating transistor 128, n-channel cascode transistor 132, and n-channel bias transistor 134 in series between power and ground. The output leg includes p-channel output transistor 130 and n-channel output transistor 140 in series between power and ground, with their drains driving DAC output DAC_OUT.

The current switched through p-channel differential transistor 22 is sent through switch 120 to the source of n-channel cascode transistor 132 in the main leg, which acts as a cascode or source-follower amplifier transistor. The current switched through p-channel differential transistor 24 is sent through switch 110 to the source of n-channel cascode transistor 116 in the biasing leg, which also acts as a cascode or source-follower amplifier transistor in the biasing leg. The current difference is amplified by the biasing and main legs to drive the output leg.

Compensating capacitor 142 is connected between the output leg and the main leg. Compensating capacitor 142 connects high-frequency components between DAC_OUT and the gates and drains of p-channel compensating transistor 126 and n-channel compensating transistor 128. Compensating capacitor 142 provides feedback from the DAC_OUT output to the main stage and provides pole compensation that is adjustable by setting the capacitance value of compensating capacitor 142. The capacitance value can be determined by simulation.

The drains of p-channel cascode transistor 114 and n-channel cascode transistor 116 in the biasing leg generate bias voltage BIASP, which is applied to the gates of p-channel bias transistors 112, 122. Bias voltage BIASN and cascode bias voltages CASCN, CASCP can be generated by a voltage divider or other bias generating circuit.

Alternate Embodiments

Several other embodiments are contemplated by the inventors. For example other implementations and circuits of the amplifiers, latches, pre-amplifiers, etc. may be substituted. The cascode structure can be removed if VDD is low or the gain for the main amplifier is sufficient for the application. Buffer stage with transistors 130, 140, 126, 128 can be removed. Any other latched structure can be used in the right side of FIG. 4. The number of bits in the register value in SAR 302 can be adjusted to achieve the desired accuracy. For example, when N is 16 bits and VREF is 2 volts, the LBS represents 30 micro-volts, which is the precision of the ADC. A different number of bits could be substituted for a different precision, and the number of bits could be fixed or could be variable.

Some embodiments may not use all components. For example, switches 284, 286 of FIG. 3 may be deleted in some embodiments. Different kinds of switches may be used, such as 2-way switches rather than 3-way switches. Muxes may be used as switches. The input resistors 280, 282 may be deleted or replaced with more complex input filters. Multiple levels of switches may be used, such as 2-way switches for switches 210-218, and then an overall switch that connects either VIN+ or VREF to these 2-way switches.

While binary-weighted capacitors have been described, other weightings could be substituted, such as decimally-weighted capacitors, prime-weighted capacitors, or linearly-weighted capacitors, or octal-weighted capacitors. The digital value could be in these other number systems, such as octal numbers rather than binary numbers.

Rather than use p-channel differential transistors, the circuit can be inverted or reversed and n-channel differential transistors substituted, and other p-channel transistors swapped to n-channel transistors, supply rails reversed, etc. Inversions may be added by swapping inverting and non-inverting inputs as desired, but do not change the overall function and thus may be considered equivalents.

The resistance and capacitance values may vary in different patterns. Capacitors, resistors, and other filter elements may be added. Switches could be n-channel transistors, p-channel transistors, or transmission gates with parallel n-channel and p-channel transistors.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation.

Inversions may be added, or extra buffering. The final sizes of transistors and capacitors may be selected after circuit simulation or field testing. Metal-mask options or other programmable components may be used to select the final capacitor, resistor, or transistor sizes.

Comparison of a reference voltage to a single analog voltage could be used, or a differential analog voltage could be compared. The differential input voltage could be latched and then the latched single-ended voltage compared to the DAC voltage. The first voltage could be sampled by a capacitor; then the second voltage could be sampled by the same capacitor. The differential charge is stored on another capacitor through the feedback of the amplifier. Another method for comparing differential analog voltages is to put a differential amplifier at the input with a defined gain. While an operational amplifier (op amp) has been described, other kinds of comparators could be used, such as non-amplifying compare buffers.

Rather than have two arrays of binary-weighted capacitors, only one array may be used for the V+ line, along with a single voltage, such as ground or Vref, or a few capacitors on the V− line.

While positive currents have been described, currents may be negative or positive, as electrons or holes may be considered the carrier in some cases. Source and sink currents may be interchangeable terms when referring to carriers of opposite polarity. Currents may flow in the reverse direction.

An equalizing switch could be added between V+ and V−. Two grounding switches could be used on the true and complement inputs lines of the inputs to re-configurable comparator stage 200. Rather than grounding, some switches could connect to another fixed voltage, such as VDD or VDD/2.

Current sources 26, 48 may be p-channel transistors with gates connected to a fixed bias voltage. The fixed bias voltage may be switched to VDD to power down the dual-input differential amplifier.

The circuit designer may choose resistors, capacitors, transistors, and other components to have a ratio that produces the desired reference voltages. While Complementary-Metal-Oxide-Semiconductor (CMOS) transistors have been described, other transistor technologies and variations may be substituted, and materials other than silicon may be used, such as Galium-Arsinide (GaAs) and other variations.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A dual-use analog-digital converter comprising:
    a charge-sharing line;
    a plurality of switches controlled by a digital value;
    an array of capacitors having weighted capacitance values, wherein array capacitors in the array connect to the charge-sharing line and to the plurality of switches;
    an analog input having an analog input voltage,
    a fixed voltage;
    wherein the digital value controls the plurality of switches to selectively connect array capacitors to the analog input voltage and to the fixed voltage;
    a terminal capacitor connected to the charge-sharing line, wherein charge is shared between the array capacitors and the terminal capacitor to generate a first compare voltage;
    a re-configurable comparator stage that receives the first compare voltage and compares the first compare voltage to a second comparator input to generate a compare output and to generate a feedback output;
    a feedback switch that connects the feedback output to the second comparator input during a digital-to-analog converter (DAC) mode, and isolates the feedback output from the second comparator input during an Analog-to-Digital Converter (ADC) mode;
    an ADC switch that connects the second comparator input to a second compare voltage during the ADC mode, and isolates the second comparator input from the second compare voltage during the DAC mode;
    control logic for adjusting the digital value to the plurality of switches during a sequence of compare operations, and for examining the compare output from the re-configurable comparator stage during the sequence of compare operations to determine a final digital value that represents the analog input voltage;
    wherein the first compare voltage generated by the array of capacitors on the charge-sharing line is compared to the second compare voltage by the re-configurable comparator stage during the ADC mode to generate the compare output when determining the final digital value that represents the analog input voltage; and
    a digital input receiving a digital input value, wherein the control logic applies the digital input value to the plurality of switches as the digital value during the DAC mode, wherein the re-configurable comparator stage generates an analog output represented by the digital input value during the DAC mode,
    whereby the re-configurable comparator stage and the array of capacitors are used both for analog-to-digital conversion and for digital-to-analog conversion.

2. The dual-use analog-digital converter of claim 1 further comprising:
    a Successive-Approximation-Register (SAR) that stores the digital value, wherein the control logic updates the digital value in the SAR during the sequence of compare operations and outputs the digital value from the SAR as the final digital value at an end of the sequence of compare operations.

3. The dual-use analog-digital converter of claim 1 wherein each switch in the plurality of switches comprises a 3-way switch that selectively connects one of the array capacitors to the analog input voltage, to a ground voltage, and to a reference voltage in response to a bit in the digital value;
    wherein the fixed voltage comprises two fixed voltages, the ground voltage and the reference voltage.

4. The dual-use analog-digital converter of claim 1 wherein the re-configurable comparator stage comprises:
    a differential pre-amplifier having a first differential input that receives the first compare voltage from the charge-sharing line and having a second differential input that receives the second comparator input, the differential pre-amplifier comparing the first compare voltage to a voltage on the second comparator input to generate an intermediate output;
    a differential latch receiving a differential latch input, the differential latch having a bi-stable triggered by the differential latch input to store a latched value, the differential latch generating the compare output from the bi-stable;
    a differential amplifier receiving a differential amp input, the differential amplifier generating the feedback output to the feedback switch in response to the differential amp input;
    a first intermediate switch that connects the intermediate output to the differential latch input during the ADC mode, and isolates the intermediate output from the differential latch input during the DAC mode; and
    a second intermediate switch that connects the intermediate output to the differential amp input during the DAC mode, and isolates the intermediate output from the differential amp input during the ADC mode.

5. The dual-use analog-digital converter of claim 4 wherein the first intermediate switch is a differential pair of switches that comprise a true switch that switches a true signal in the intermediate output, and a complement switch that switches a complement signal in the intermediate output;
    wherein the second intermediate switch is a differential pair of switches that comprise a true switch that switches a true signal in the intermediate output, and a complement switch that switches a complement signal in the intermediate output.

6. The dual-use analog-digital converter of claim 5 wherein the differential pre-amplifier further comprises:
    a first differential transistor having a gate receiving the first compare voltage;
    a second differential transistor having a gate receiving the second comparator input;
    a first switched current sink resistance;
    a second switched current sink resistance;
    a first gain switch that connects the first differential transistor to the first switched current sink resistance during the ADC mode, and isolates the first differential transistor from the first switched current sink resistance during the DAC mode; and
    a second gain switch that connects the second differential transistor to the second switched current sink resistance during the ADC mode, and isolates the second differential transistor from the second switched current sink resistance during the DAC mode;

whereby gain is increased by connecting the first switched current sink resistance and the second switched current sink resistance during the ADC mode.

7. The dual-use analog-digital converter of claim 6 wherein the array of capacitors comprises 16 array capacitors having binary-weighted capacitance values;
wherein capacitance values of the array capacitors are 1, 2, 4, 8, 16, 32, 64, 128, 256, 512, 1K, 2K, 4K, 8K, 16K, and 32K times a smallest capacitance value, wherein K is 1024.

8. The dual-use analog-digital converter of claim 7 wherein the terminal capacitor has a capacitance value substantially equal to a smallest capacitance value for array capacitors in the array of capacitors.

9. The dual-use analog-digital converter of claim 1 further comprising:
a second charge-sharing line connected to the ADC switch and carrying the second compare voltage;
a plurality of second switches controlled by a second digital value;
a second array of capacitors having weighted capacitance values, wherein second array capacitors in the second array connect to the second charge-sharing line and to the plurality of second switches;
a second analog input having a second analog input voltage,
wherein the second digital value controls the plurality of second switches to selectively connect second array capacitors to the second analog input voltage and to the fixed voltage; and
a second terminal capacitor connected to the second charge-sharing line, wherein charge is shared between the second array capacitors and the second terminal capacitor to generate the second compare voltage.

10. The dual-use analog-digital converter of claim 9 wherein the second analog input connects to a reference voltage;
wherein the analog input and the second analog input connect to a differential analog input.

11. A reversible analog-digital converter comprising:
an analog input;
a digital input;
a charge-sharing line;
a plurality of switches controlled by digital bits that indicate when to connect to the analog input and when to connect to a fixed voltage;
a plurality of capacitors having differing capacitance values and each having a terminal connected to the charge-sharing line and another terminal connected to a switch in the plurality of switches;
control logic that generates the digital bits from the digital input when operating in a Digital-to-Analog Converter (DAC) mode, and that generates a sequence of the digital bits to cause the plurality of switches to adjust voltages applied to the plurality of capacitors to vary a voltage of the charge-sharing line to test a sequence of digital values during an Analog-to-Digital Converter (ADC) mode to determine a final digital value that represents a voltage of the analog input;
a re-configurable comparator stage that comprises:
a differential pre-amplifier having a first differential input connected to the charge-sharing line and a second differential input, for generating a differential intermediate output;
a first intermediate switch that connects the differential intermediate output to a differential latch input during the ADC mode, and isolates the differential intermediate output from the differential latch input during the DAC mode;
a second intermediate switch that connects the differential intermediate output to a differential amp input during the DAC mode, and isolates the differential intermediate output from the differential amp input during the ADC mode;
a differential latch that receives the differential intermediate output from the first intermediate switch and stores a compare value determined by the differential intermediate output;
wherein the compare value is applied to the control logic to determine a portion of the final digital value during ADC mode;
a differential amplifier that receives the differential intermediate output from the second intermediate switch during DAC mode and buffers the differential intermediate output to generate a DAC output; and
a feedback switch that connects the DAC output to the second differential input during the DAC mode, and isolates the DAC output from the second differential input during the ADC mode;
wherein the DAC output is an analog output voltage that represents the digital input when operating in the DAC mode,
whereby the plurality of capacitors and the re-configurable comparator stage are used both for conversion to analog an conversion to digital.

12. The reversible analog-digital converter of claim 11 wherein the differential pre-amplifier comprises:
a current source that generates a source current;
a first differential transistor having a gate that receives the first differential input which controls conducting a portion of the source current to a first differential intermediate output node of the differential intermediate output;
a first resistor;
a first switch that connects the first resistor to the first differential intermediate output node during the ADC mode, and isolates the first differential intermediate output node from the first resistor during the DAC mode;
a second differential transistor having a gate that receives the second differential input which controls conducting a portion of the source current to a second differential intermediate output node of the differential intermediate output;
a second resistor; and
a second switch that connects the second resistor to the second differential intermediate output node during the ADC mode, and isolates the second differential intermediate output node from the second resistor during the DAC mode,
whereby the first resistor and the second resistor are switched during ADC mode to adjust gain of the differential pre-amplifier.

13. The reversible analog-digital converter of claim 12 further comprising:
a second charge-sharing line;
a second analog input;
a plurality of second switches controlled by digital bits that indicate when to connect to the second analog input and when to connect to the fixed voltage;
a plurality of second capacitors having differing capacitance values and each having a terminal connected to the second charge-sharing line and another terminal connected to a second switch in the plurality of second switches; and an ADC switch that connects the second charge-sharing line to the second differential input to the differential pre-amplifier during the ADC mode, and isolates the second differential input from the differential pre-amplifier during the DAC mode.

14. The reversible analog-digital converter of claim 13 wherein the fixed voltage is a reference voltage or a ground voltage.

15. The reversible analog-digital converter of claim 12 wherein the differential amplifier comprises:
a first p-channel bias transistor having a gate receiving a first bias voltage;
a first p-channel cascode transistor, in series with the first p-channel bias transistor, having a gate receiving a first cascode bias voltage and a drain generating the first bias voltage;
a first n-channel cascode transistor, in series with the first p-channel cascode transistor, having a gate receiving a second cascode bias voltage and a drain generating the first bias voltage;
a first n-channel bias transistor having a gate receiving a second bias voltage, and a drain connected to the first n-channel cascode transistor, wherein the drain is also connected to the first differential intermediate output node through the second intermediate switch during the DAC mode;
a second p-channel bias transistor having a gate receiving a second bias voltage;
a second p-channel cascode transistor, in series with the second p-channel bias transistor, having a gate receiving the second cascode bias voltage and a drain connected to a first output gate node;
a p-channel compensating transistor having a gate and a drain connected to a compensating node and a source connected to the first output gate node;
an n-channel compensating transistor having a gate and a drain connected to the compensating node and a source connected to a second output gate node;
a second n-channel cascode transistor, in series with the second p-channel cascode transistor, having a gate receiving the second cascode bias voltage and a drain connected to the second output gate node;
a second n-channel bias transistor having a gate receiving the second bias voltage, and a drain connected to the second n-channel cascode transistor, wherein the drain is also connected to the second differential intermediate output node through the second intermediate switch during the DAC mode;
a p-channel output transistor having a gate receiving the first output gate node and a drain driving the DAC output and a source connected to a power supply;
an n-channel output transistor having a gate receiving the second output gate node and a drain driving the DAC output and a source connected to a ground; and
a compensating capacitor connected between the DAC output and the compensating node.

16. The reversible analog-digital converter of claim 13 wherein the differential latch comprises:
a first differential latch transistor having a gate connected by the first intermediate switch to the differential intermediate output during the ADC mode, and a drain connected to a first bistable node;
a first cross-coupled transistor having a drain connected to the first bistable node and a gate connected to a second bistable node;
a first mirror transistor having a gate connected to the first bistable node, for generating a first minor current;

a second differential latch transistor having a gate connected by the second intermediate switch to the differential intermediate output during the ADC mode, and a drain connected to the second bistable node;
a second cross-coupled transistor having a drain connected to the second bistable node and a gate connected to the first bistable node;
a second mirror transistor having a gate connected to the second bistable node, for generating a second mirror current;
a first output cascode transistor having a drain generating the compare value on a compare output, and having a gate receiving a first cascode bias voltage, and a channel passing the second minor current; and
a second output cascode transistor having a drain generating the compare value on the compare output, and having a gate receiving a second cascode bias voltage, and a channel passing the second minor current.

17. A dual-direction analog-digital converter comprising:
an first analog input having a first analog input voltage,
a second analog input having a second analog input voltage,
a digital input receiving a digital input value;
a fixed voltage;
a first charge-sharing line;
first switch means for switching voltages in response to a digital value;
first array means for storing charge using weighted capacitance values of first capacitors, wherein each first capacitor is connected to the first charge-sharing line and to a plurality of the first switch means;
wherein the digital value controls the first switch means to selectively connect first capacitors to the first analog input voltage and to the fixed voltage;
first terminal capacitor means for sharing charge from the first charge-sharing line, wherein charge is shared between the first capacitors and the first terminal capacitor means to generate a first compare voltage;
a second charge-sharing line;
second switch means for switching voltages in response to a second digital value;
second array means for storing charge using weighted capacitance values of second capacitors, wherein each second capacitor is connected to the second charge-sharing line and to a plurality of the second switch means;
wherein the second digital value controls the second switch means to selectively connect second capacitors to the second analog input voltage and to the fixed voltage;
second terminal capacitor means for sharing charge from the second charge-sharing line, wherein charge is shared between the second capacitors and the second terminal capacitor means to generate a second compare voltage;
re-configurable means, receiving the first compare voltage, for comparing the first compare voltage to a second comparator input to generate a compare output and to generate a feedback output;
feedback switch means for connecting the feedback output to the second comparator input during a digital-to-analog converter (DAC) mode, and for isolating the feedback output from the second comparator input during an Analog-to-Digital Converter (ADC) mode;
ADC switch means for connecting the second comparator input to a second compare voltage during the ADC mode, and for isolating the second comparator input from the second compare voltage during the DAC mode;

control logic means for adjusting the digital value and the second digital value during a sequence of compare operations during ADC mode, and for examining the compare output from the re-configurable means during the sequence of compare operations to determine a final digital value that represents a combination of the first analog input voltage and the second analog input voltage, and for applying the digital input value to the plurality of first switch means as the digital value during the DAC mode, wherein the re-configurable means generates an analog output represented by the digital input value during the DAC mode, whereby the re-configurable means and the first array means of first capacitors are used both for analog-to-digital conversion and for digital-to-analog conversion.

18. The dual-direction analog-digital converter of claim 17 further comprising:

Successive-Approximation-Register (SAR) means for storing the digital value, wherein the control logic means is further for updating the digital value in the SAR means during the sequence of compare operations and for outputting the digital value from the SAR means as the final digital value at an end of the sequence of compare operations.

19. The dual-direction analog-digital converter of claim 17 wherein the re-configurable means comprises:

differential pre-amplifier means, having a first differential input that receives the first compare voltage from the first charge-sharing line and having a second differential input that receives the second comparator input, for comparing the first compare voltage to a voltage on the second comparator input to generate an intermediate output;

differential latch means, receiving a differential latch input, for triggering a bi-stable in response to the differential latch input to store a latch value, the differential latch means also for generating the compare output from the bi-stable;

differential amplifier means, receiving a differential amp input, for generating the feedback output to the feedback switch means in response to the differential amp input;

first intermediate switch means for connecting the intermediate output to the differential latch input during the ADC mode, and for isolating the intermediate output from the differential latch input during the DAC mode; and second intermediate switch means for connecting the intermediate output to the differential amp input during the DAC mode, and for isolating the intermediate output from the differential amp input during the ADC mode.

20. The dual-direction analog-digital converter of claim 17 wherein the dual-direction analog-digital converter is a block integrated on a System-On-a-Chip (SOC).

* * * * *